United States Patent [19]

Inoue

[11] Patent Number: 5,708,373
[45] Date of Patent: Jan. 13, 1998

[54] BOOST CIRCUIT

[75] Inventor: Yoshinori Inoue, Hyogo, Japan

[73] Assignee: Mitsubishi Denki Kabushiki Kaisha, Tokyo, Japan

[21] Appl. No.: 597,371

[22] Filed: Feb. 8, 1996

[30] Foreign Application Priority Data

May 29, 1995 [JP] Japan .................... 7-130294

[51] Int. Cl.[6] .................... H03K 19/02; H03K 19/0175
[52] U.S. Cl. .................... 326/88; 326/26; 326/80; 326/82; 327/390; 327/589
[58] Field of Search .................... 326/88, 80–81, 326/68, 63, 82–83, 26–27, 22–23; 327/390–391, 589; 365/230.06

[56] References Cited

U.S. PATENT DOCUMENTS 5,059,816 10/1991 Kobatake .................... 326/88
5,153,467 10/1992 Mao .................... 326/83
5,248,907 9/1993 Lin et al. .................... 326/27

Primary Examiner—Edward P. Westin
Assistant Examiner—Jon Santamauro
Attorney, Agent, or Firm—Lowe, Price, LeBlanc & Becker

[57] ABSTRACT

When input signal IN rises to an "H" level, node N1 attain an "H" level, and output terminal OUT is charged to a level of $VCC-V_{TH}$ by n channel transistor. Capacitor is charged by the "H" level signal transmitted through inverters, and the charged potential is superimposed on output terminal OUT. When a short pulse is merged with input signal IN, RS flipflop is latched, and node N1 attains an "L" level, thereby discharging the voltage of the output terminal. When the output terminal attains an "L" level, NAND gate is opened and RS flipflop is reset, thereby raising the output terminal again to a boost voltage.

3 Claims, 6 Drawing Sheets

5,708,373

BOOST CIRCUIT

BACKGROUND OF THE INVENTION

1. Field of the Invention

The present invention relates to boost circuits. More particularly, the present invention relates to a boost circuit included in an output buffer of a DRAM and outputting an output voltage at a level higher than a supply voltage.

2. Description of the Background Art

FIG. 4 is a block diagram showing the entire structure of a conventional DRAM. In FIG. 4, a row address strobe signal $\overline{RAS}$ applied from an external source is input to an $\overline{RAS}$ buffer 1, and an internal $\overline{RAS}$ signal is generated and applied to an address control circuit 4. Address control circuit 4 applies the externally applied row address signal to an address buffer 7 based on the internal $\overline{RAS}$ signal. An X address signal is applied from address buffer 7 to a row decoder 11, thereby designating an X address of a memory cell 8. After row address strobe signal $\overline{RAS}$ is applied, a column address strobe signal $\overline{CAS}$ is applied to a $\overline{CAS}$ buffer 2, converted to an internal $\overline{CAS}$ signal and input to address control circuit 4, a write control circuit 5 and a readout control circuit 6. Address control circuit 4 applies the externally applied column address signal to address buffer 7 in response to the internal $\overline{CAS}$ signal. Address buffer 7 applies a Y address signal to a column decoder 9 based on the column address signal, and column decoder 9 designates a Y address of memory cell 8. A write enable signal $\overline{WE}$ for distinguishing read/write is input to a $\overline{WE}$ buffer 3, and an internal $\overline{WE}$ signal is generated. When the $\overline{WE}$ signal attains an "L" (Low) level, write control circuit 5 is enabled, and data input to an input buffer 14 is written to memory cell 8 through a write driver 15. Upon a readout, write enable circuit $\overline{WE}$ attains an "H" (High) level, and readout control circuit 6 activates a preamplifier 12 and an output buffer 13. Data is read out from memory cell 8 and output from a sense amplifier 10 through preamplifier 12 and output buffer 13.

FIG. 5 is a diagram showing the output buffer shown in FIG. 4. NAND gates 31 and 33 have one input end receiving readout data RD and $\overline{RD}$ from preamplifier 12 shown in FIG. 4 and the other input end receiving an output enable signal OE. Upon readout, output enable signal OE attains an "H" level and NAND gate 31 is opened. The output thereof is inverted by an inverter 32, and readout data is boosted by a boost circuit 20 and is output to an output terminal through an n channel transistor 35. When readout data RD is not applied, an output of NAND gate 33 attains an "L" level, and inverted by an inverter 34, thereby rendering an n channel transistor 36 conductive, so that the output terminal attains an "L" level.

Boost circuit 20 is provided in FIG. 5 because of the following reason. Since n channel transistors 35 and 36 are employed as an output buffer, data of an "H" level is reduced by a threshold voltage $V_{TH}$ of n channel transistor 35, and the voltage output to the output terminal has a lower level of $Vcc-V_{TH}$. The delay of access is also generated. Therefore, the output of boost circuit 20 is made to the level of $Vcc+\alpha$.

FIG. 6 is a diagram showing one example of a conventional boost circuit. Referring to FIG. 6, six inverters 21–26 are connected in series, and an output of inverter 26 is applied to an output terminal OUT through a capacitor 27. Between output terminal OUT and a connection point of an output of inverter 22 and an input of inverter 23, an n channel MOS transistor 28 is connected, which receives a supply voltage Vcc at its gate.

FIG. 7 is a timing chart illustrating operations of the boost circuit shown in FIG. 6. FIG. 8 is also a timing chart illustrating operations of the boost circuit when a short pulse is undesirably merged with an input signal of the boost circuit.

As shown in FIG. 7(a), when an input signal IN rises from an "L" level to an "H" level, input signal IN is successively inverted by inverters 21 and 22. Referring to FIG. 7(b), a node N1, which is an output of inverter 22, rises from an "L" level to an "H" level. This "H" level signal is transmitted to output terminal OUT through n channel transistor 28. At this time, output terminal OUT is charged to a level of $VCC-V_{TH}$ ($V_{TH}$ is a threshold voltage of n channel transistor 28) as shown in FIG. 7(d). The "H" level signal at node N1 is successively delayed and transmitted through inverters 23–26, and a node N2 rises from an "L" level to an "H" level as shown in FIG. 7(c).

Due to the "H" level signal at node N2, a boost level voltage of $Vcc+\alpha$ is output to output terminal OUT by the coupling capacitance of capacitor 27. At this time n channel transistor 28 is off because its gate is at the Vcc level, node N1 is also at the Vcc level, and output terminal OUT is at the boost level. Therefore, the boost level of output terminal OUT will not be brought to node N1.

If a short pulse falling to an "L" level is merged with input signal IN as shown in FIG. 8(a), the level of node N1 is lowered as shown in FIG. 8(b), thereby turning on n channel transistor 28 and lowering the boost level of output terminal OUT. Since node N2 is connected to capacitor 27, the amplitude level of the short pulse arriving at node N2 is decreased and the level of output terminal OUT remains low.

Next, description will be made of the reason for merger of a short pulse with input signal IN. FIG. 9 is a block diagram showing the entire structure of a DRAM. Referring to FIG. 9, one DRAM consists of a plurality of memory blocks 41–44 if the DRAM has a large storage capacity. Readout data is output from a preamplifier corresponding to each of memory blocks 41–44, and one readout data is selected by an address selector 45. Here, the difference in arrangements of memory blocks 41–44 gives rises to a time difference between the outputs of the preamplifiers, whereby a short pulse may possibly be merged with readout data RD. Furthermore, output enable signal OE might attain an "H" level before readout data RD goes through a change because it is applied from an external pin. As a result, a short pulse is generated and the boost level is lowered, whereby an "H" level of the output becomes undesirably low.

SUMMARY OF THE INVENTION

Therefore, an object of the present invention is to provide a boost circuit which prevents decline in the boost level even when a short pulse is merged with an input signal.

Briefly stated, in the present invention, an output terminal is charged by a transistor in response to an input signal of a buffer circuit rising from a low level to a high level, a capacitor is charged in response to an output signal of the buffer circuit rising from a low level to a high level and superimposes the charged potential on the output terminal, and when a pulse signal falling to a low level is merged with the input signal after the input signal has risen from a low level to a high level, an input of a high level signal to the buffer circuit is prevented until the output terminal attains a low level.

Therefore, according to the present invention, it is possible to make the output terminal attain a low level and then to increase its level to a boost level even if a pulse signal is merged with the input signal.

According to a more preferred embodiment of the present invention, when a pulse signal falling to a low level is merged with the input signal after the input signal has risen from a low level to a high level, a latch circuit is latched and its latch output is applied to the buffer circuit as an input signal, and in response to the level of the output terminal falling to a low level, the latch state of the latch circuit is released. The latch circuit includes an RS flipflop having a set input end which receives the input signal and a gate circuit inhibiting reset of the RS flipflop by the input signal until the output terminal attains a low level.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
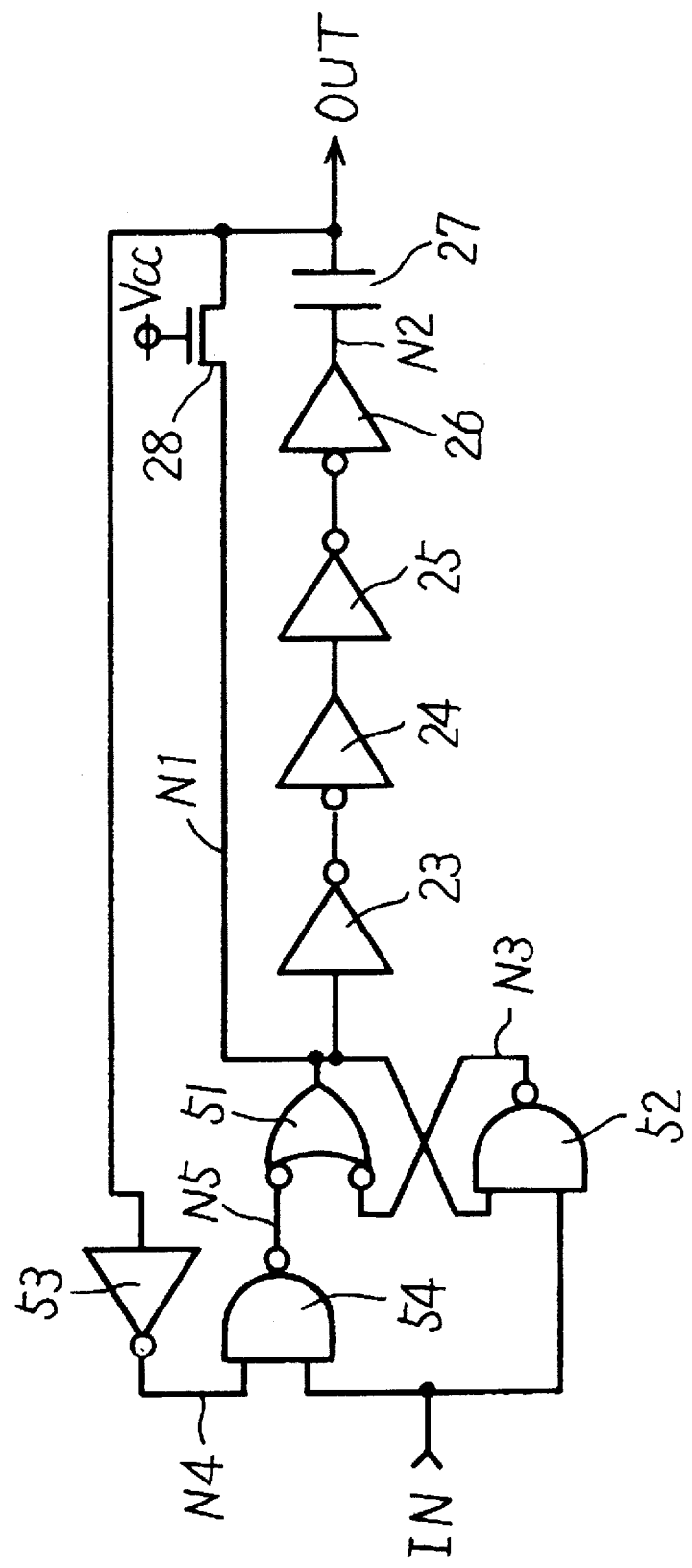
FIG. 1 is a circuit diagram of a boost circuit in accordance with one embodiment of the present invention.
Figure 6:
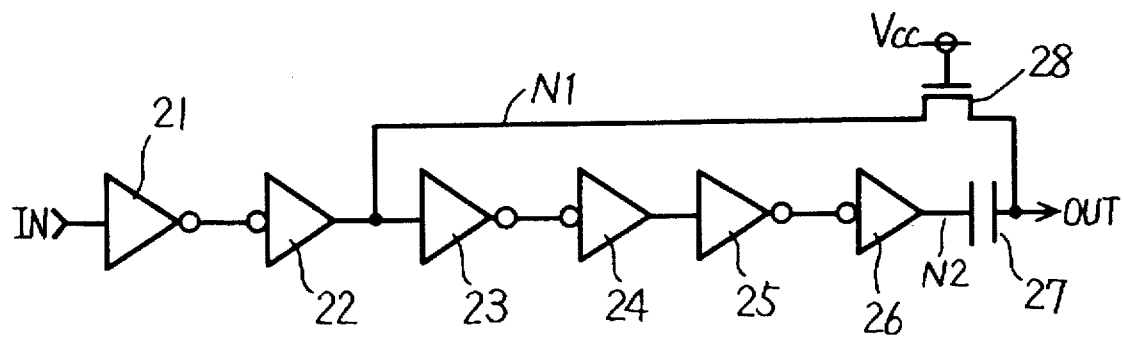
FIG. 6 is a circuit diagram showing one example of a conventional boost circuit.
Figure 7:
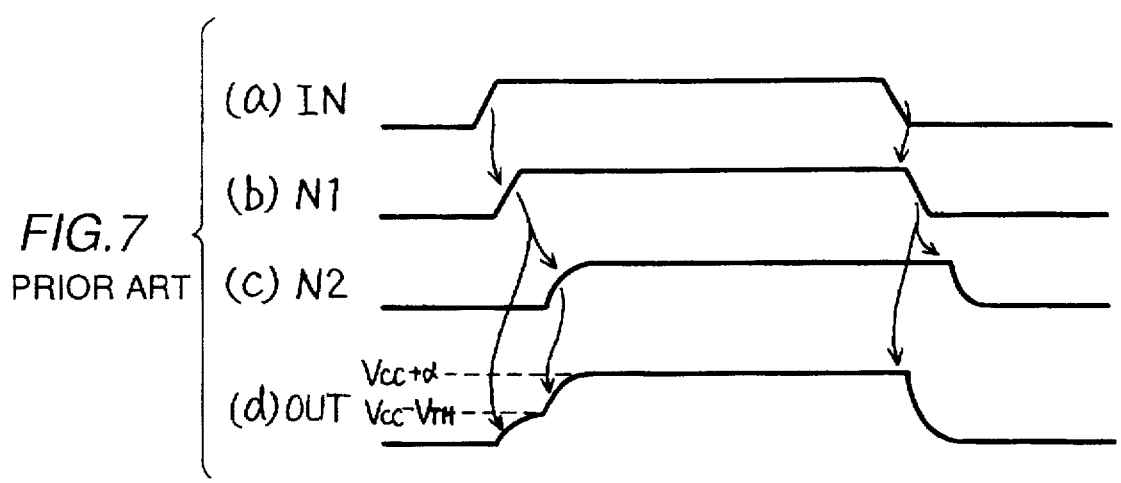
FIG. 7 is a timing chart illustrating operations of the boost circuit shown in FIG. 6.
Figure 8:
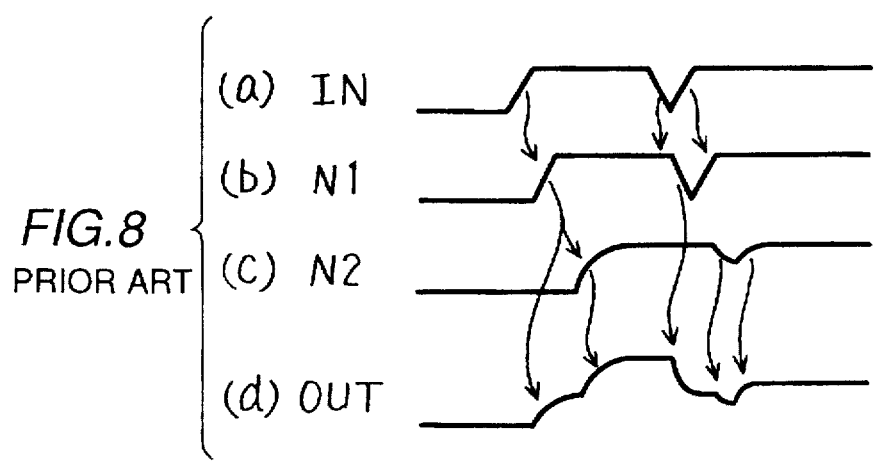
FIG. 8 is a timing chart illustrating operations of the boost circuit when a short pulse is merged with an input signal.
Figure 9:
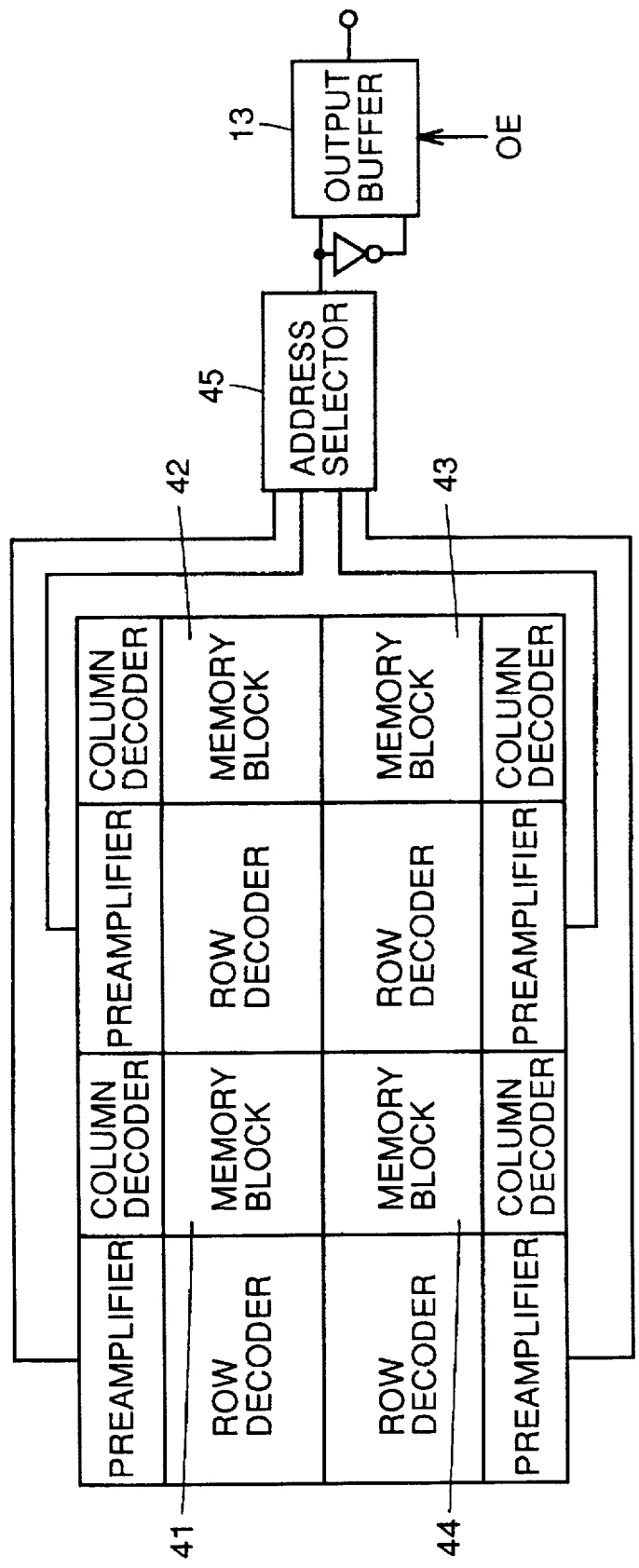
FIG. 9 is a diagram illustrating the reason for merger of a short pulse with an input signal.

FIG. 1 is a circuit diagram showing a boost circuit in accordance with one embodiment of the present invention. In the boost circuit of the present embodiment, four inverters 23–26 are connected in series, one end of a capacitor 27 is connected to an output node N2 of inverter 26, and an n channel transistor 28 is connected between an input end of an inverter 23 and the other end of capacitor 27, similarly to the conventional example of FIG. 6 as described above. A supply voltage Vcc is applied to the gate of n channel transistor 28.

In addition, an RS flipflop consisting of NAND gates 51 and 52 is provided on the input side of inverter 23. An input signal IN is applied to a set input end which is one input end of NAND gate 52, and an output signal of NAND gate 54 is applied to a reset input end which is one input end of NAND gate 51. NAND gate 54 has one input end receiving input signal IN and the other input end receiving the level of an output terminal OUT inverted by an inverter 53.

Figure 2:
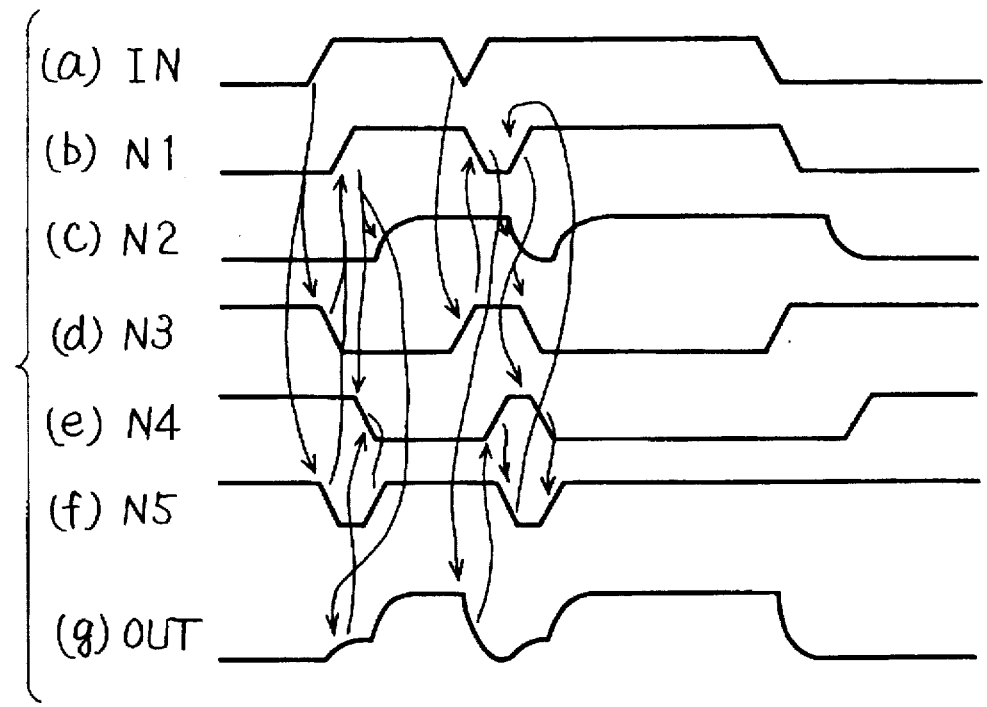
FIG. 2 is a timing chart illustrating operations of the boost circuit shown in FIG. 1.

FIG. 2 is a timing chart illustrating operations of the boost circuit shown in FIG. 1. Now, operations of the boost circuit shown in FIG. 1 will be described with reference to FIG. 2. As shown in FIG. 2(a), when input signal IN rises to an "H" level, a node N3 which is an output of NAND gate 52 falls to an "L" level as shown in FIG. 2(d), and a node N1 which is an output of NAND gate 51 rises to an "H" level as shown in FIG. 2(b). At this time, since output terminal OUT is at an "L" level as shown in FIG. 2(g), the output terminal is charged to the level of Vcc-$V_{TH}$ by n channel transistor 28. The "H" level signal of node N1 is transmitted to node N2 by inverters 23–26, and capacitor 27 is charged by this potential as shown in FIG. 2(c). The charge voltage of capacitor 27 is added to output terminal OUT, and the boosted level of Vcc+α is output from output terminal OUT as shown in FIG. 2(g).

If input signal IN is pulled down to an "L" level momentarily as shown in FIG. 2(a), nodes N3 and N5 attain an "H" level as shown in FIG. 2(d) and (f). As a result, node N1 falls to an "L" level as shown in FIG. 2(b), and the RS flipflop is latched. At this time, since output terminal OUT is at the level of Vcc+α, a node N4 which is an output of inverter 53 attains an "L" level as shown in FIG. 2(e) and NAND gate 54 is closed. Consequently, the latch state of the RS flipflop is maintained even if input signal IN rises after the merger of the short pulse.

Meanwhile, the voltage charged at output terminal OUT is discharged by node N1 attaining an "L" level. When the potential of output terminal OUT attains an "L" level, the output of inverter 53 attains an "H" level, thereby opening NAND gate 54. Node N5 attains an "L" level and node N1 attains an "H" level, whereby output terminal OUT is charged again to VCC-$V_{TH}$. Thereafter, capacitor 27 is charged by the "H" level signal transmitted through inverters 23–26, and the boost level is output from output terminal OUT.

Therefore, in accordance with the present embodiment, even if a short pulse falling to an "L" level is merged with the input signal after the input signal rises to an "H" level as shown in FIG. 2(a), output terminal OUT can be boosted to the potential of Vcc+α after falling down to an "L" level under the influence of the short pulse, as shown in FIG. 2(g).

Figure 3:
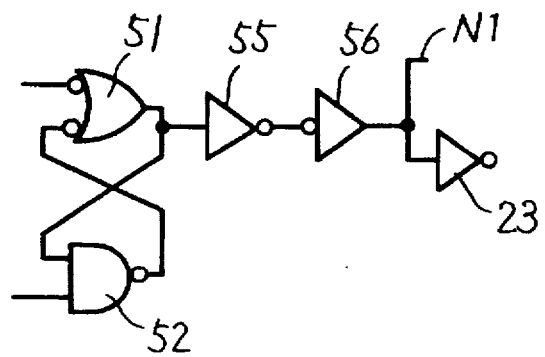
FIG. 3 shows an example of an improvement in the embodiment shown in FIG. 1.
Figure 4:
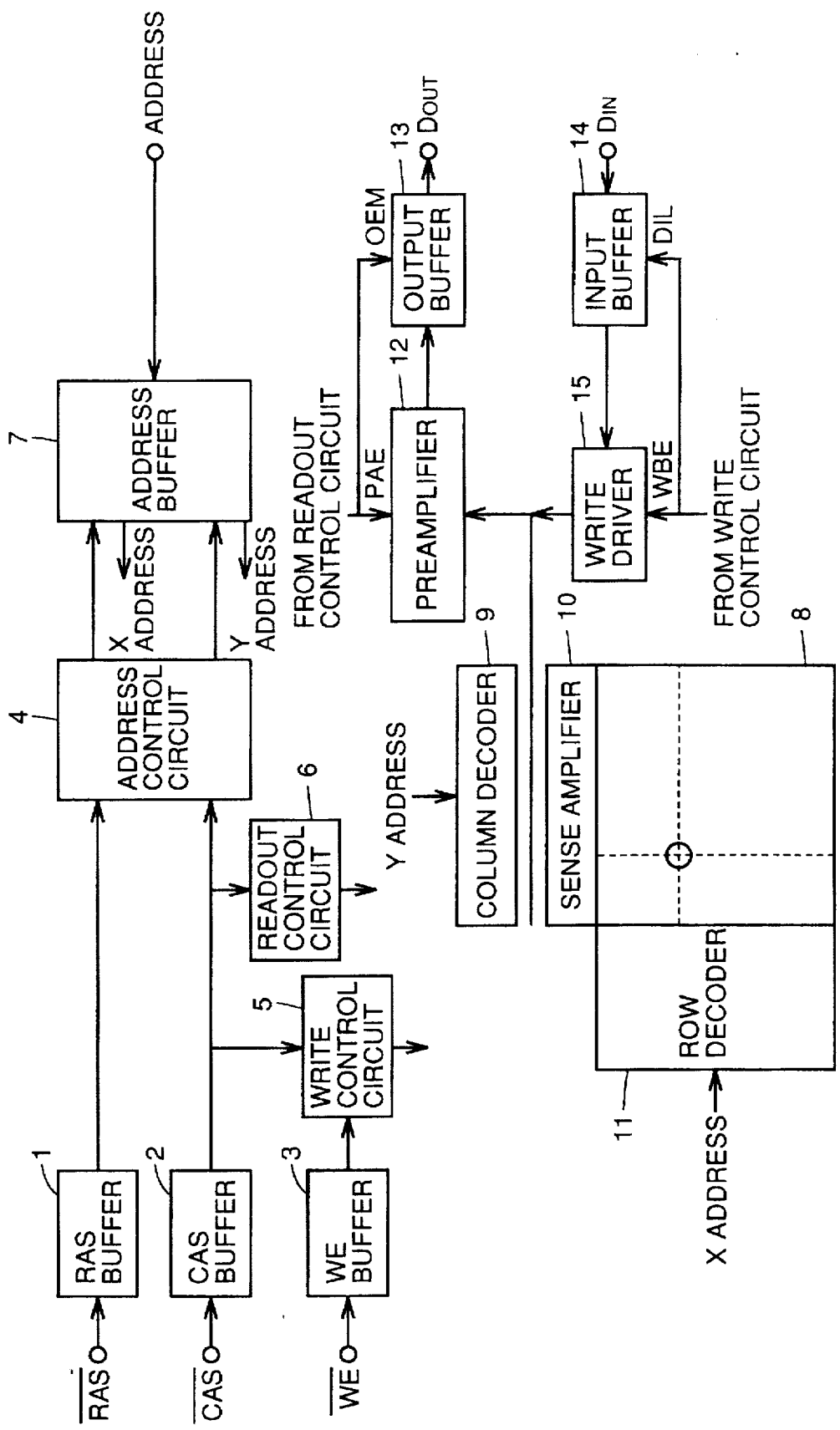
FIG. 4 is a schematic block diagram showing a conventional DRAM.
Figure 5:
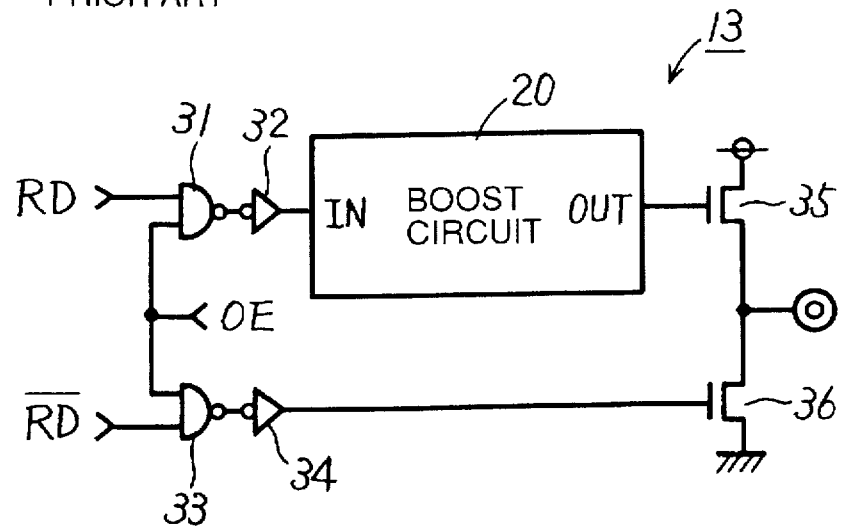
FIG. 5 is a diagram showing one example of the output buffer shown in FIG. 4.

FIG. 3 is a diagram showing another embodiment of the present invention. In the embodiment shown in FIG. 1, speeding up the latching operations by NAND gates 51 and 52 requires such a ratio as to drive node N1 to an "L" level as fast as possible. Since the output of NAND gate 51 is connected to one input end of NAND gate 52, the input of inverter 23 and n channel transistor 28 in the embodiment shown in FIG. 1, a heavy load is applied, whereby a fall of node N1 to an "L" level is delayed when a short pulse is merged with input signal IN. Therefore, in the embodiment shown in FIG. 3, two more inverters 55 and 56 are inserted between the output of NAND gate 51 and inverter 23, thereby reducing the load of node N1 and facilitating its fall to an "L" level.

As described above, in accordance with the present invention, a transistor is rendered conductive in response to an input signal input to a buffer circuit rising from a low level to a high level, thereby charging an output terminal, a capacitor is charged in response to the output signal of the buffer circuit rising from a low level to a high level and the charged potential is superimposed to the output terminal, and, when a pulse signal is merged with the input signal, an input of a high level signal to the buffer circuit is prevented until the output terminal attains a low level, so that the output terminal can be raised to a boost level after falling down to a low level.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A boost circuit for outputting to an output terminal an output voltage of a level higher than a supply voltage, comprising:

buffer means for outputting an input signal;

a transistor responsive to the input signal of said buffer means rising from a low level to a high level and charging a potential of said output terminal;

a capacitor charged in response to an output signal of said buffer means rising from a low level to a high level and superimposing the charged potential on a potential of said output terminal; and input prevention means for preventing an input of a high level signal to said buffer means until the potential of said output terminal attains a low level, when a pulse signal falling to a low level is merged with said input signal after said input signal rises from a low level to a high level.

2. The boost circuit according to claim 1, wherein said input prevention means includes latch means for attaining a latch state when a pulse signal falling to a low level is merged with said input signal after said input signal rises from a low level to a high level, and having its latch state released in response to the level of said output terminal falling to a low level to provide a latch output thereof to said buffer means as an input signal.

3. The boost circuit according to claim 2, wherein said latch means includes, an RS flipflop receiving said input signal at its set input end, and a gate circuit for inhibiting reset of said RS flipflop by said input signal until the level of said output terminal becomes a low level.

* * * * *